United States Patent [19]

Ohngemach et al.

[11] Patent Number: 4,965,294

[45] Date of Patent: Oct. 23, 1990

[54] PHOTOINITIATOR DISPERSIONS

[75] Inventors: Jörg Ohngemach, Reinheim; Heiko Zeh, Weiterstadt, both of Fed. Rep. of Germany

[73] Assignee: Merck Patent Gesellschaft mit beschränkter Haftung, Darmstadt, Fed. Rep. of Germany

[21] Appl. No.: 347,633

[22] Filed: May 5, 1989

[30] Foreign Application Priority Data

May 7, 1988 [DE] Fed. Rep. of Germany ....... 3815622

[51] Int. Cl.$^5$ .......................... C08K 5/06; C08K 5/07
[52] U.S. Cl. ........................................ 522/79; 522/85; 502/150; 502/167; 502/168; 502/172
[58] Field of Search ............... 502/172, 167, 168, 150; 522/79

[56] References Cited

U.S. PATENT DOCUMENTS

| | | | |
|---|---|---|---|
| 4,186,108 | 1/1980 | Carlson et al. | 502/168 X |
| 4,366,228 | 12/1982 | Specht et al. | 502/172 X |
| 4,576,975 | 3/1986 | Reilly | 502/167 X |

Primary Examiner—Patrick P. Garvin
Attorney, Agent, or Firm—Millen, White and Zelano

[57] ABSTRACT

The invention relates to aqueous photoinitiator dispersions for incorporation into aqueous dispersions of radiation-curable binder systems.

9 Claims, No Drawings

PHOTOINITIATOR DISPERSIONS

SUMMARY OF THE INVENTION

The present invention relates to aqueous photoinitiator dispersions for incorporation into aqueous dispersions of radiation-curable binder systems.

Photochemically induced polymerization reactions have assumed great importance in industry, particularly when rapid curing of thin layers is desired, for example, in the curing of paint coats and plastic coatings on paper, wood, metal, and plastic or in the drying of printing inks. Compared with conventional methods of drying or curing of coatings, in these applications, radiation curing in the presence of photoinitiators is characterized by conserving raw materials and energy, the low thermal load of the substrate and, in particular, a high rate of curing. Photoinitiators which are suitable for this purpose are predominantly compounds of the type of the aromatic ketones, such as benzophenones, benzoin ethers, benzil monoketals, dialkoxyacetophenones, thioxanthones, and hydroxyalkylphenones, and derivatives originating from structures of these types. As described, in the specifications of German Pat. No. 2,722,264 and European Pat. No. 3002, hydroxyalkylphenone photoinitiators have proven particularly advantageous, not only because of their high reactivity, but also because of their minimal tendency to yellow the cured layers and the excellent dark storage stability of the radiation-curable systems to which they have been added.

Aqueous binder systems which are free from volatile organic components have attracted interest as environmentally friendly coating agents, since their use avoids, or at least reduces, environmental pollution by organic solvents and monomers is avoided or at least reduced. Further, the risk of fire when handling solvent-containing coating, impregnation and adhesive preparations is reduced, and they are cost effective in that the cost of organic solvents can be saved.

Radiation-curable aqueous systems, principally in the form of aqueous dispersions, accordingly combine the advantages of radiation curing with the benefit of the absence of solvents in the aqueous system.

Aqueous systems based on radiation-curable binders make particular demands on the photoinitiator used. Some considerations which must be taken into account include, e.g., the solubility or ease of incorporating and the stability of the initiator in the aqueous system, the dark storage stability of the aqueous system to which the initiator has been added, the behavior of the initiator when the water is removed, and, in particular, its reactivity, which determines the curing rate. Most photoinitiators of the above-mentioned types, although employed predominantly in non-aqueous radiation-curable systems, however, generally also appear to be suitable for aqueous systems. The specific hydroxyalkylphenone derivatives described in the laid-open applications German Offenlegungsschrift No. 3,203,096 and German Offenlegungsschrift No. 3,512,179 are particularly suitable for aqueous systems, in particular for aqueous dispersions of radiation-curable binder systems, given their low steam volatility and their particularly favorable solution or mixing properties with the system.

However, the use of photoinitiators in aqueous dispersions of radiation-curable binder systems is still capable of being improved. It is particularly desirable to obtain a more homogenous incorporation of photoinitiators into the system, improve the storage stability of the systems to which the photoinitiators have been added, and the reactivity, i.e., the curing result which can be achieved.

Upon further study of the specification and appended claims, further objects and advantages of this invention will become apparent to those skilled in the art.

When used hitherto, the photoinitiators in the pure, unchanged state have been added to the aqueous binder dispersions just before processing thereof and distributed in the latter as uniformly as possible by stirring or dispersion.

Strikingly and entirely surprisingly, it has now been found that radiation-curable aqueous binder dispersions to which photoinitiators have been added have considerably better curing and/or storage properties if the photoinitiators are themselves incorporated in the binder dispersions in the form of aqueous dispersions. The aqueous photoinitiator dispersions according to the invention are in this case composed in a manner such that they contain in each case about 10–50 percent by weight, based on the total amount of the aqueous photoinitiator dispersion of photo-initiator and about 5–50 percent by weight, based on the content of photoinitiator, of non-ionic surfactants with a resultant HLB (hydrophiliclipophilic balance) value between 8 and 18.

The invention, therefore, relates to aqueous photoinitiator dispersions for incorporation into aqueous dispersions of radiation-curable binder systems, containing 10–50 percent by weight, based on the total amount of aqueous photoinitiator dispersion, of photoinitiator and 5–50 percent by weight based on the content of photoinitiator, of non-ionic surfactants with a resultant HLB value between 8 and 18.

The invention further relates to a process for the preparation of photoinitiator-containing aqueous dispersions of radiation-curable binder systems, the photoinitiators being incorporated in the form of an aqueous dispersion.

In principle, all aromatic ketone-type photoinitiators which are known and customary in the art of radiation curing are suitable for the aqueous photoinitiator dispersions according to the invention. It is immaterial here whether they are in the solid or liquid aggregate state at room temperature. A large number of different photoinitiators from the groups comprising the benzophenones, benzoyl ethers, benzil monoketals, dialkoxyacetophenones, thioxanthones and hydroxyalkylphenones are known to a person skilled in the relevant art; one can easily make a selection from this group in accordance with the requirements and the specific demands of the particular radiation-curable systems and their application. Numerous photoinitiators of these types of compound are commercially available. Typical representatives which may be mentioned as examples are benzophenone, benzil dimethyl ketal, benzoin methyl ether, benzoin isopropyl ether, diethoxyacetophenone, dibutoxyacetophenone, methyl phenyl glycoxylate, 2chlorothioxanthone, 2-ethylthioxanthone, 2isopropylthioxanthone, 2,4-diethylthioxanthone, phenyl 2-hydroxy-2-propyl ketone, 4-isopropylphenyl 2-hydroxy-2-propyl ketone, 4-n-dodecylphenyl 2-hydroxy-2-propyl ketone, 4-(2-hydroxyethoxy)phenyl 2-hydroxy-2-propyl ketone, 4-(2acryloyloxyethoxy)-phenyl 2-hydroxy-2-propyl ketone, and 1-benzoylcyclohexanol. Photoinitiators of the hydroxyalkylphenone type, in particular phenyl 2-hydroxy-2-propyl ketone, 1-benzoyl-cyclohexanol and 4-(2-hydroxyethoxy)phenyl 2-hydroxy-2-propyl ketone, are particularly preferred due to their known advantageous properties in many respects. The photoinitiators can exist individually or as mixtures of two or more photoinitiators in the aqueous photoinitiator dispersions according to the invention. In addition, it is also possible to process mixtures of one or more photoinitiators with co-initiators, sensitizers, and accelerators which increase the photoreactivity and/or the spectral sensitivity, such as, in particular, organic amino compounds, to form corresponding dispersions. Typical mixtures of photoinitiators with one another or with co-initiators and sensitizers are known from the prior art, in particular from the publications cited above. Examples of these are commercially available mixtures of phenyl 2-hydroxy-2-propyl ketone and isopropylthioxanthone, and of phenyl 2-hydroxy-2-propyl ketone, isopropylthioxanthone, and 2-dimethylaminoethyl benzoate.

The aqueous photoinitiator dispersions according to the invention contain 10–50 percent by weight, preferably 25–45 percent by weight, of such photoinitiators or photoinitiator mixtures.

In order to prepare dispersions which are stable and homogenous with the photoinitiators and water, dispersion auxiliaries are necessary. It has become apparent that virtually only non-ionic surfactants are suitable for this purpose, it being necessary to establish a resultant HLB value between 8 and 18 by mixing, normally, 2 or, where appropriate, more surfactants. The resultant HLB value of the surfactant mixture is preferably between 10 and 16.

A large number of non-ionic surfactants of a very wide variety of types and their HLB values which characterize the dispersion behavior are known and available to those skilled in the art from the relevant prior art. Any non-ionic surfactant which will achieve the desired effect is suitable. A listing of individual surfactants and of specific HLB values may be taken, f.e., from Kirk-Othmer, Vol. 8, page 900–930.

When surfactants having different HLB values are combined, the resultant HLB value of the mixture is produced additively in the ratio of the amounts by weight of the different surfactants employed. Surfactant combinations which satisfy the demands can thus easily be selected, and their specific suitability for the particular photoinitiator can be determined by simple trials.

Mixtures of polyglycol ether derivatives of fatty alcohols, mixtures of polyglycol ether derivatives of fatty alcohol fatty acid esters, or mixtures of the aforementioned derivatives of alcohols and esters have proven particularly suitable. Stearyl alcohol and cetyl alcohol should be particularly emphasized here of the basic fatty alcohols, and fatty alcohol stearates and fatty alcohol palmitates of the fatty acid esters. Customary examples of non-ionic surfactants of this type are polyoxyethylene stearyl alcohols, such as polyoxyethylene (100) stearyl alcohol with an HLB value of 19 and polyoxyethylene stearyl stearates, such as polyoxyethylene (5) stearyl stearate with an HLB value of 7.5. These and similar surfactants which are equally suitable are known to those skilled in the art and obtainable from industrial production.

The surfactants or surfactant mixtures normally make up from 5–50 percent by weight, in particular 10–30% by weight, based on the content of photoinitiator, of the aqueous photoinitiator dispersions according to the invention.

The aqueous photoinitiator dispersions according to the invention are prepared in a manner which is known per se for aqueous dispersions using auxiliaries which are customary for this purpose. The preparation method is essentially unimportant if the framework conditions indicated with respect to the amount of photoinitiator, surfactant, and HLB value are observed. The best compositions and procedures for each individual case can easily be determined without problem by simple trials using routine experience.

It has proven advantageous to first homogeneously mix the organic components, i.e., the photoinitiator(s) and surfactants. Warming to about 60–100 degrees C. may be helpful in individual cases. The water is then added in the proposed amount, preferably demineralized, and at the same temperature, with vigorous mixing using customary stirrers or homogenizers, and the batch is mixed vigorously until a homogenous stable dispersion is obtained. If necessary, further customary dispersion auxiliaries may also be added, such as, in particular, thickeners based on water-soluble, high molecular weight organic compounds, for example, polyvinyl alcohols, polyvinylpyrrolidone or cellulose ethers.

The aqueous photoinitiator dispersions obtained are stable for a sufficiently long time under customary storage conditions if stored away from light. They also survive repeated climatic temperature changes, such as in the range from about $-10$ to $+20$ degrees C. If premature separation should occur, rehomogenization is not a problem.

The aqueous photoinitiator dispersions according to the invention can be employed very advantageously for initiation of aqueous dispersions of radiation-curable binder systems. A particular advantage here is that the photoinitiators in the form of the aqueous dispersions according to the invention can be incorporated into these systems better and more rapidly than if they are dispersed alone. Entirely unexpectedly, it was observed that aqueous dispersions of radiation-curable binder systems into which the corresponding photoinitiators had been incorporated in the form of an aqueous dispersion have better storage stability, in particular with respect to gelling due to premature, non-radiation-induced cross-linking, and the coatings produced with the aid of such systems exhibit a better curing. The better curing result is apparent, for example, from a shorter irradiation time in order to achieve surface-dry or fully cured coatings and/or from the production of greater layer hardnesses under given process conditions. The coatings can thus be cured more rapidly or at lower energy costs, i.e., more economically, and/or qualitatively better.

The better curing results found are particularly astonishing since, in the case of coating with aqueous binder dispersions, the water present is normally removed before the radiation curing by drying at elevated temperatures, after which the initiator-containing layer material to be cured is no longer in the form of an aqueous dispersion. There is still no scientific explanation for the positive effects which occur when photoinitiators are incorporated into radiation-curable binder dispersions not alone but instead in the form of an aqueous dispersion. However, while not wishing to be bound by any particular theory, the improved results may have something to do with a finer and more homogenous distribution of the photoinitiator in the system and a possibly attendant greater "proximity" of the photoinitiator to the radiation-reactive components.

Photoinitiated aqueous dispersions of radiation-curable binder systems are prepared according to the invention by homogeneously incorporated the photoinitiator dispersion into the binder dispersion with the aid of customary stirrers or homogenizers. In principle, the aqueous photoinitiator dispersions according to the invention are employed in amounts such that the photoinitiator is present in the radiation-curable system in a concentration comparable with that in the case of conventional use. Photoinitiators are generally employed in amounts of from 0.1–20 percent by weight, preferably 0.5–10 percent by weight, based on the polymerization components. Depending on the content of photoinitiator, corresponding amounts of photoinitiator dispersion should, therefore, be selected. Due to the better curing properties of the photoinitiators in the form of aqueous dispersions, however, the amount of photoinitiator used can also be correspondingly reduced, which can increase the economic efficiency due to lower consumption of initiator and can, in some cases, reduce possible adverse effects due to the lower residual content of initiator or its photolysis products in the cured layer.

Aqueous dispersions of radiation-curable binder systems, of which, incidentally, many variations are prepared in industry, are taken to mean dispersions with water of components which can be cured by photopolymerization or photocrosslinking. It is also possible for these dispersions to contain other auxiliaries and additives which are customary in this technology. The radiation-curable component can comprise single- or multi-component systems based on mono- or polyfunctional, ethylenically unsaturated monomers, oligomers, prepolymers, or polymers which can be polymerized by means of free radicals. Their proportion in the binder dispersions is generally between 20 and 95 percent by weight, preferably 40 to 70 percent by weight, the water percentages adding up to 100 and the auxiliaries and additives being added in various amounts depending on the requirements and the purpose of use. Radiation-curable binder dispersions are predominantly based on unsaturated oligomers and prepolymers, such as unsaturated polyester, polyacrylate, epoxy, polyurethane and polyamide resins, in particular acrylated polyesters, acrylated acrylic and epoxy resins, acrylated polyurethanes and polyamides. They sometimes also contain unsaturated monomers, preferably of the acrylic and vinyl type, in particular acrylates of mono-, di-, or polyalcohols, such as, for example, ethylene glycol diacrylate, 1,6-hexanediol diacrylate, 1,6-hexanediol diacrylate, trimethylolpropane diacrylate and pentaerythritol triacrylate.

Depending on the use of the final compositions, dyes, pigments, and/or fillers which are customary in paint or coating technology, and levelling agents, lubricants, wetting agents, thickeners and matting agents can be added to the radiation-curable binder dispersions.

The radiation-curable binder dispersions are applied by customary coating methods to the substrates which are intended for this purpose, such as, for example, metal, wood, paper, glass, and ceramics. The radiation curing of the coatings is normally carried out after removal of all water from the layer. This is achieved by evaporation, preferably promoted by brief heating to temperatures up to about 100 degrees C. or by brief IR irradiation. In the case of porous substrates, only very short preheating times are usually necessary, since the majority of the water is absorbed by the substrate. Preheating or water removal is occasionally also omitted.

The subsequent photopolymerization is carried out by irradiation with light or UV irradiation in the wavelength range from 250–500 nm, preferably 300–400 nm. As radiation sources, sunlight or artificial light can be used. For example, mercury vapor high-pressure, medium-pressure, or low-pressure lamps and xenon and tungsten lamps are customary.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius; and, unless otherwise indicated, all parts and percentages are by weight.

The entire texts of all applications, patents, and publications, if any, cited above and below, and of corresponding application(s) P 38 15 622.9, filed in West Germany on May 7, 1988, are hereby incorporated by reference.

EXAMPLES

A. Materials used

Photoinitiators: '(a) Phenyl 2-hydroxy-2-propyl ketone (Darocur 1173, E. Merck)
(b) 4-Isopropylphenyl 2-hydroxy-2-propyl ketone (Darocur 1116, E. Merck)
(c) Mixture of (a) and 2-isopropylthioxanthone/9:1 (Darocur 1664, E. Merck)
(d) Mixture of (a), 2-isopropylthioxanthone and 2-dimethylaminoethyl benzoate/3:2:2 (Darocur 2273, E. Merck)
(e) Mixture of (a) and 4-(2-hydroxyethoxy)phenyl 2-hydroxy-2-propyl ketone (Darocur 2959, E. Merck)/7:3
(f) Mixture of 1-benzoylcyclohexanol (Irgacure 184, Ciba-Geigy) and (a)/8:2
(g) 2,2-Diethoxyacetophenone (DEAP, Upjohn)
(h) 2,2-Dibutoxyacetophenone (Uvatone 8301, Upjohn)
(i) Methyl phenyl glycoxylate (Vicure 55, Stauffer Chemicals).

Surfactants:
(I) Polyoxyethylene (100) stearyl alcohol (Brij 700, ICI Atlas Chemie) HLB value: 19.0
(II) Polyoxyethylene (2) stearyl alcohol (Brij 72, ICI Atlas Chemie) HLB value: 5.0
(III) Polyoxyethylene (5) stearyl stearate (Arlatone 985, ICI Atlas Chemie) HLB value: 7.5

Binder systems:
(A) Aqueous dispersion of a polyester acrylate (Laromer PE 55 W, BASF)
(B) Aqueous dispersion of a polyurethane acrylate (Huls RC 1622, Chemische Werke Hüls)
(C) Aqueous dispersion of a nitrocellulose polyester acrylate (Waloran NH 6002, Wolff Walsrode)

B. Preparation of photoinitiator dispersions Photoinitiators and surfactants were mixed at about 80° C. in the mixing ratios indicated in the table below. The amount of demineralized water, likewise warmed to about 80° C., required to make up to 100 % by weight was then slowly added continuously with vigorous stirring. The mixture was homogenized for about a further 10 minutes at this temperature and then until room temperature was reached. The photoinitiator dispersions were ready for use or for transfer into light-protected containers after they had been stirred slowly for an additional 3 hours.

| Example No. | Photoinitiator/ % by weight | Surfactants/ % by weight | | Resultant HLB value |
| --- | --- | --- | --- | --- |
| 1 | (a)/40 | (I)/4.8 | (II)/3.2 | 13.4 |
| 2 | (a)/40 | (II)/4.5 | (III)/5.5 | 12.5 |
| 3 | (b)/40 | (I)/4.3 | (III)/2.7 | 14.5 |
| 4 | (c)/40 | (I)/6.7 | (III)/4.3 | 14.5 |
| 5 | (d)/40 | (I)/7.0 | (III)/2.0 | 16.5 |
| 6 | (e)/40 | (I)/7.3 | (III)/4.7 | 14.5 |
| 7 | (f)/40 | (I)/8.9 | (III)/3.1 | 16.0 |
| 8 | (g)/40 | (I)/3.6 | (III)/2.4 | 14.5 |
| 9 | (h)/40 | (I)/2.4 | (III)/3.6 | 12.0 |
| 10 | (i)/40 | (I)/3.5 | (III)/5.5 | 11.0 |

C. Preparation of photoinitiator-containing binder dispersions and comparative experiments For the experiments below, the systems A1...A10, B1...B10, C1...C10 and comparative systems A(a)...A(i), B(a)...B(i) and C(a)...C(i), to which the respective photoinitiator was added on its own in the appropriate amount, were prepared from binder systems (A), (B) and (C), selected photoinitiator dispersions from Examples 1-10 and demineralized water in the mixing ratios set forth in the table below by stirring rapidly for 10 minutes.

The photoinitiator-containing binder systems were stored at room temperature for about another 12 hours after the preparation.

| % by Weight | Binder System | Initiator | Water |
| --- | --- | --- | --- |
| A1...A10 | 90 | 3.8 | 6.2 |
| A(a)...A(i) | 90 | 1.5 | 8.5 |
| B1...B10 | 90 | 2.5 | 7.5 |
| B(a)...B(i) | 90 | 1.0 | 9.0 |
| C1...C10 | 90 | 7.5 | 2.5 |
| C(a)...C(i) | 90 | 3.0 | 7.0 |

The systems of this invention and the comparative systems contain the same effective amount of the respective initiator.

COMPARATIVE EXPERIMENT SERIES 1: STORAGE STABILITY

Systems and comparative systems were stored at 60° C. and the time before the first changes (gelling) became visible was determined.

| System | A1 | A2 | A3 | A4 | A6 | A7 | | |
| --- | --- | --- | --- | --- | --- | --- | --- | --- |
| Comparative system | A(a) | A(a) | A(b) | A(c) | A(e) | A(f) | | |
| Storage time in weeks | 3 | 3 | 3 | 3 | 3 | 2 | | |
| | 2 | 2 | 2 | 1 | 2 | 1 | | |
| System | C2 | C3 | C4 | C5 | C6 | C7 | C8 | C9 |
| Comparative system | C(a) | C(b) | C(c) | C(d) | C(e) | C(f) | C(g) | C(h) |
| Storage time in weeks | 2 | 3 | 3 | 3 | 3 | 3 | 3 | 3 |
| | 1 | 2 | 2 | 1 | 1 | 1 | 2 | 1 |

It is apparent that the systems into which the photoinitiators had been incorporated in the form of the aqueous dispersions according to the invention have considerably improved storage stability.

COMPARATIVE EXPERIMENT SERIES 2: SURFACE DRYING

The ready-to-use aqueous binder systems were applied to glass plates (10×10 cm) using a 150 μm film-drawing frame. In order to remove the water from the layers, the coated glass plates were then stored in a drying oven for 10 minutes at 80° C.

The UV curing was then carried out by passing the coated plates on a variable-speed conveyor belt under Hg medium-pressure lamps (lamp power 1×80 W/cm for systems (A) and (B), 2×80W/cm for systems (C); lamp distance 6 cm). The maximum speeds at which the dry surfaces were still obtained were determined for each of the systems and comparative systems.

| System | A1 | A2 | A3 | A4 | A7 | A8 | A9 | A10 |
| --- | --- | --- | --- | --- | --- | --- | --- | --- |
| Comparative system | A(a) | A(a) | A(b) | A(c) | A(f) | A(g) | A(h) | A(i) |
| Belt speed in m/min | 25 | 35 | 22.5 | 22.5 | 35 | 17.5 | 12.5 | 27.5 |
| | 15 | 17 | 12.5 | 18 | 22.5 | 12.5 | 7.5 | 17.5 |
| System | B2 | B4 | B5 | B8 | | | | |
| Comparative system | B(a) | B(c) | B(d) | B(g) | | | | |
| Belt speed in m/min | 35 | 27 | 18 | 25 | | | | |
| | 17 | 25 | 15 | 20 | | | | |
| System | C2 | C4 | C5 | C6 | C7 | C9 | C10 | |
| Comparative system | C(a) | C(c) | C(d) | C(e) | C(f) | C(h) | C(i) | |
| Belt speed in m/min | 22.5 | 35 | 25 | 22.5 | 22.5 | 12.5 | 22.5 | |
| | 17 | 25 | 22.5 | 17.5 | 17.5 | 10 | 15 | |

The systems in which the photoinitiators had been incorporated in the form of the aqueous dispersions according to the invention can be cured to give dry surfaces at a significantly higher belt speed.

COMPARATIVE EXPERIMENT 3: LAYER HARDNESS

For system A1 and comparative system A(a), the layer hardness was determined, after storage for 20 hours, at a belt speed of 5 m/min (König pendulum hardness, DIN 53157)

| | |
| --- | --- |
| A1 | 97 seconds |
| A(a) | 67 seconds |

The system into which the photoinitiator had been incorporated in the form of the aqueous dispersion according to the invention exhibits a significantly greater layer hardness.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. An aqueous photoinitiator dispersion useful for incorporation into aqueous dispersions of a radiation-curable binder system, comprising 10 to 50% by weight, based on the total amount, of at least one photoinitiator, and 5 to 50% by weight, based on the content of photoinitiator, of at least one non-ionic surfactant having an HLB value of 8 and 18.

2. A photoinitiator dispersion of claim 1, comprising 25 to 45% by weight of photoinitiator.

3. A photoinitiator dispersion of claim 1, wherein the photoinitiator is a mixture of at least two photoinitiators.

4. A photoinitiator dispersion of claim 1, comprising 10 to 30% by weight, based on the content of at least the photoinitiator, of at least one nonionic surfactant.

5. A photoinitiator dispersion of claim 1, wherein the at least one non-ionic surfactant has a resultant HLB value of between 10 to 16.

6. A photoinitiator dispersion of claim 1, wherein the at least one non-ionic surfactant comprises a mixture of polyglycol ether derivatives of fatty alcohols and fatty alcohol fatty acid esters.

7. A photoinitiator dispersion of claim 6, wherein the fatty alcohol is stearyl alcohol or cetyl alcohol.

8. A photoinitiator of claim 6, wherein the fatty alcohol fatty acid esters are fatty alcohol palmitates and fatty alcohol stearates.

9. In an aqueous radiation-curable binder system comprising a binder and an aqueous photoinitiator dispersion, the improvement wherein the aqueous photoinitiator dispersion is one of claim 1.

* * * * *